United States Patent [19]

Rhoades et al.

[11] 4,151,547

[45] Apr. 24, 1979

[54] ARRANGEMENT FOR HEAT TRANSFER BETWEEN A HEAT SOURCE AND A HEAT SINK

[75] Inventors: John M. Rhoades, Waynesboro; Patrick J. Montanino, Charlottesville, both of Va.

[73] Assignee: General Electric Company, New York, N.Y.

[21] Appl. No.: 831,211

[22] Filed: Sep. 7, 1977

[51] Int. Cl.² .................... H01L 23/02; H01L 23/42; H01L/23/44
[52] U.S. Cl. .................... 357/81; 357/79; 165/80; 165/105; 174/16 HS; 361/387
[58] Field of Search .................... 357/79, 81; 165/80, 165/105; 174/16 HS; 361/387, 388, 386, 389

[56] References Cited

U.S. PATENT DOCUMENTS

| | | | |
|---|---|---|---|
| 3,391,242 | 7/1968 | Sudges | 357/81 |
| 3,492,535 | 1/1970 | Behrendt | 361/387 |
| 3,801,882 | 4/1974 | Ward | 357/81 |
| 3,805,123 | 4/1974 | Rieger | 357/81 |
| 3,928,907 | 12/1975 | Chisholm | 357/81 |

FOREIGN PATENT DOCUMENTS 659585 3/1963 Canada .................... 174/16 HS

Primary Examiner—Andrew J. James
Attorney, Agent, or Firm—W. C. Bernkopf

[57] ABSTRACT

An arrangement for improving the transfer of heat from a heat source to a heat sink. The improvement is provided by the use of a malleable dimpled wafer which is deformed between the heat source and heat sink so as to improve the direct contacting of the juxtaposed adjacent surfaces of the heat source and heat sink, thereby resulting in improved thermal conductivity therebetween.

12 Claims, 5 Drawing Figures

ARRANGEMENT FOR HEAT TRANSFER BETWEEN A HEAT SOURCE AND A HEAT SINK

BACKGROUND OF THE INVENTION

1. Field of the Invention

This invention relates to an arrangement for improving the transfer of heat between a heat source and a heat sink, and, more particularly, between a power transistor and its adjacent heat sink.

2. Description of the Prior Art

In order to improve the performance characteristics of temperature sensitive devices, such as semi-conductors and power transistors in particular, the power transistors are generally mounted to a heat dissipation device such as a heat sink. However, it has been found that when mounting a power transistor in what is commonly known as a TO3 type package to a standard heat sink, inasmuch as adjacent surfaces of the transistor and heat sink have high and low spots, no more than 5 to 10 percent of the overlapping area therebetween is actually ever in contact. This minimal direct surface contact results in a limitation on the amount of heat that can be transferred from the power transistor to the heat sink, and severely restricts the thermal efficiency of the overall arrangement. The maximum power level at which the power transistor can be operated when using power transistors in, for example, pulse-width modulated servo drive systems, is thereby limited, and the amount of drive which can be delivered to a servo motor is also limited. Thus the overall system becomes limited simply because the power generated by the transistor cannot be efficiently dissipated. One method of improving the efficiency of the transfer of heat from the power transistor to the heat sink has been to apply liquid silicone grease to the surface area between the transistor and heat sink. While it has been observed that this may result in an improvement in heat transfer between the power transistor and the heat sink, in view of the liquid nature of the material, the silicone grease has been noted to drip onto electrical contact areas to which the power transistor is to be connected, thereby resulting in a degradation of the electrical performance of the circuit using the power transistors.

OBJECTS OF THE INVENTION

It is, therefore, an object of this invention to provide an improved arrangement for transferring heat between a heat source and a heat sink in a manner which will not adversely effect electrical performance of the heat source.

It is another object of this invention to provide an improved heat transfer arrangement between a power transistor and its adjacent heat sink in order to enable the transistor to operate at higher power levels than before.

It is still a further object of this invention to provide a heat transfer arrangement between a heat source and its adjacent heat sink by providing for an increase in the direct contacting of the adjacent surfaces therebetween.

This and other objects of the invention will be pointed out hereinafter.

SUMMARY OF THE INVENTION

According to a broad aspect of this invention, there is provided an improved heat transfer arrangement between a heat source and its adjacent heat sink by deforming a malleable dimpled wafer therebetween. This results in the wafer making direct contact with between 50 to 60 percent of the adjacent overlapping surface area of both the heat sink and heat source, thereby resulting in greater heat transfer between the heat source and heat sink. A wafer can generally be approximately the same size as the heat source, which is typically a power transistor mounted in a TO3 type package. The wafer should also be thick enough to be handled but not too thick to make its deformation difficult. A typical wafer can be dimpled to approximately its same normal thickness, is a good thermal conductor and is sufficiently malleable by having a yield strength of less than 1000 psi.

DESCRIPTION OF THE PREFERRED EMBODIMENT

Referring now to FIGS. 1–5, the invention will now be explained. In accordance with the invention, the improved heat transfer arrangement is provided by a dimpled malleable wafer 10 positioned between the adjacent surface of a heat source 12 and a heat sink 14. While the heat source can be any active power generating device, such as a silicon controlled rectifier, the heat source shown in this invention is a standard power transistor which is housed in a TO3 type package. A power transistor in a TO3 type package has two leads 16 and 18 which extend through holes in the wafer and the heat sink so as to be electrically insulated therefrom. Heat sink 14 can be any standard commercially available heat sink. Wafer 10 should have the same areal configuration as the areal dimension of that surface of the power transistor which is adjacent to heat sink 14.

Figure 1:
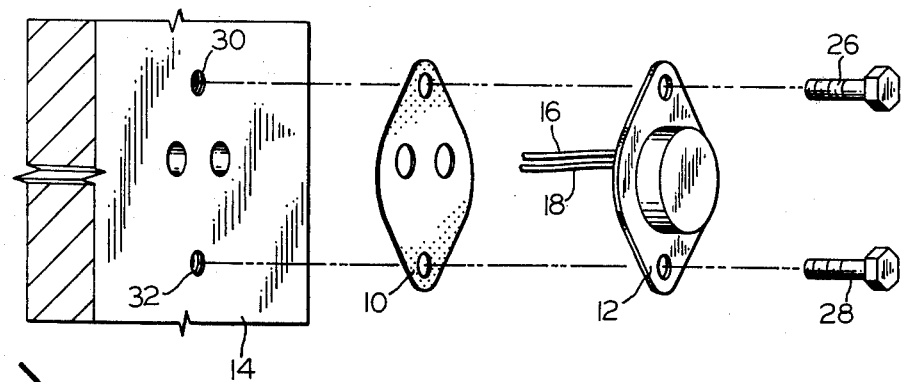
FIG. 1 is an exploded perspective view of a heat source mounted to a heat sink in accordance with the heat transfer arrangement of this invention.
Figure 2:
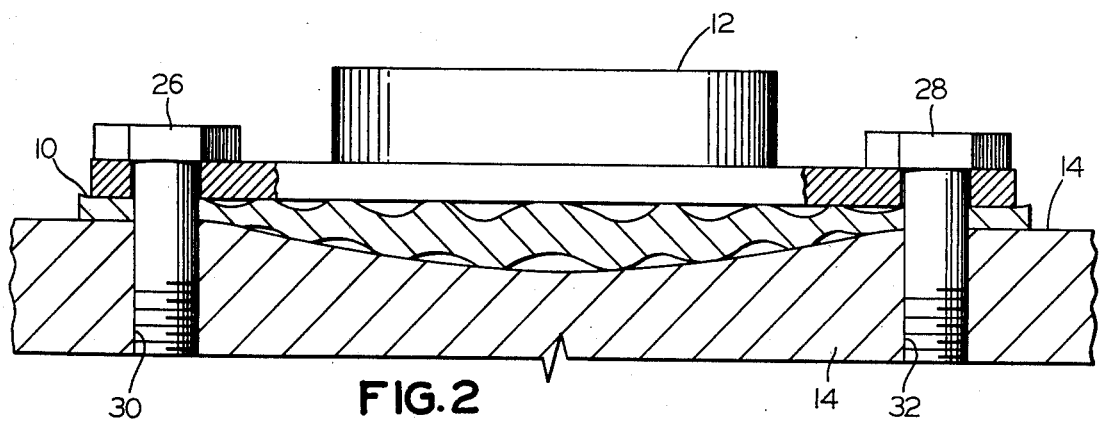
FIG. 2 is a cross sectional view of a heat source mounted to a heat sink in accordance with this invention, wherein the distance between the surface of the heat sink and the adjacent surface of the heat source is least toward the outer edge of the heat source.
Figure 3:
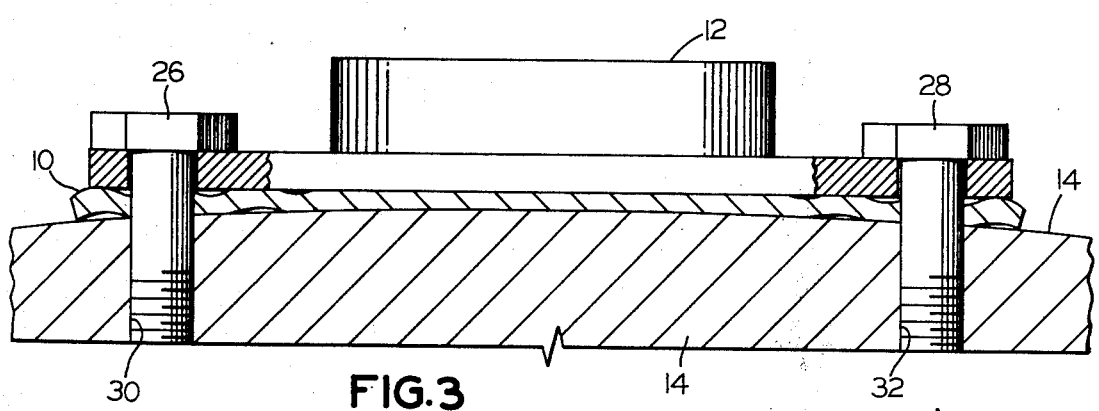
FIG. 3 is a cross sectional view of the heat transfer arrangement in accordance with this invention, wherein the distance between the surface of a heat source and the adjacent surface of the heat sink is least at a point near the center of the heat source.
Figure 4:
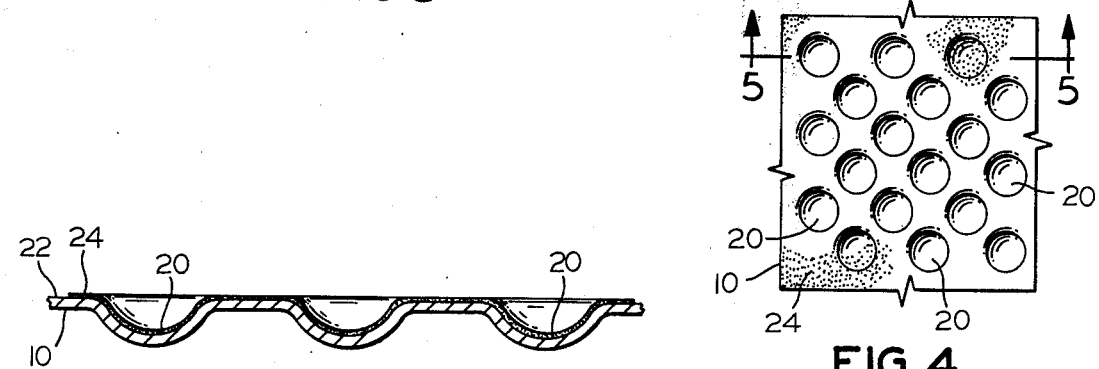
FIG. 4 is a top partial exploded view of the wafer shown in FIG. 1 depicting the orientation of adjacent dimples.
Figure 5:
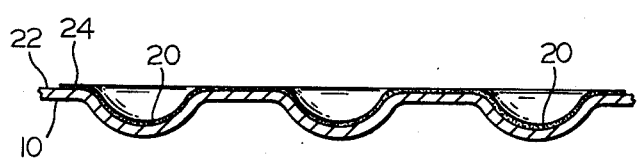
FIG. 5 is a cross sectional view of the wafer shown in FIG. 4 taken along line 5—5.

As shown in FIGS. 2 and 3, the distance between the adjacent surfaces of the power transistor and heat sink are not always uniformly spaced apart. More particularly, in FIG. 2, the distance between the adjacent surfaces is greatest toward the middle of the transistor, while in the example shown in FIG. 3, the distance between the adjacent surfaces is greatest at the periphery of the transistor. Thus, in order to improve the flow characteristics of the material to accommodate the variations in distance which normally occur between the adjacent surfaces of the power transistor and the heat sink, wafer 10 should be dimpled. The resulting thickness of the wafer would be approximately half or the same as its normal thickness, if the wafer were undimpled, since the original wafer material stretches during the forming of the dimples therein. The wafer normally should be a good thermal conductor, malleable and soft so as to be readily deformable. Materials having a yield strength of less than 1000 psi generally are considered sufficiently malleable under the circumstances. While gold, silver, zinc and lead are examples of typically suitable malleable, soft deformable materials having excellent thermal conductivity, lead and zinc may be more desirable in view of their being less expensive than gold or silver. Furthermore, while the above-mentioned materials have been given as examples of suitable materials, it should be understood that the class of materials for carrying out the purposes of this invention is not limited to the above-described materials. By way of example, therefore, in a preferred embodiment, a lead wafer 5 mils in thickness can be dimpled using standard pressing techniques in a suitable dye, and cut to approximately a one inch square from a roll of lead foil. The dimples can be approximately 10 to 60 mils apart center to center, and, more particularly in this example, 47.5 mils apart, so that the wafer can be provided with 21±1 dimples per lineal inch in each direction. As shown in FIG. 4, adjacent rows of dimples can be staggered with respect to each other so as to maximize the density of dimples on the wafer. As shown in FIG. 5, each dimple 20 extends from a top surface 22 of wafer 10 in rounded (hemispheric) concave or diamond shaped fashion. A standard clear acrylic adhesive 24 can be attached to top surface 22 of wafer 10 so that the wafer can be fixed or bonded to the adjacent surface of heat source (transistor) 12 during final assembly to avoid having the wafer slip and touch the leads of the transistor and cause a short circuit.

As shown in FIGS. 2 and 3, the dimpled wafer can be placed between heat source (transistor) 12 and the adjacent surface of the heat sink, and the transistor can be fastened to the heat sink using standard bolts 26 and 28 which are screwed into respective tapped holes 30 and 32 within the heat sink, while wafer 10 is squeezed between the transistor and the heat sink. By way of example, if the bolts were No. 8 size bolts, 21 inch pounds of tightening torque can be applied thereto to squeeze and deform the dimpled lead wafer and fasten the transistor to the heat sink, or if the bolts were No. 10 size bolts, 23 inch pounds of tightening torque could be applied thereto.

As shown in FIG. 2, where the distance between the adjacent surfaces of the heat source and heat sink is least (near the bolts or the periphery of the transistor), the dimpled lead wafer is deformed by a maximum amount and the adjacent surfaces of the heat sink and transistor are substantially contacted by the thermally conductive wafer, while toward the center of the transistor where the distance between the transistor and heat sink is greatest, minimum deformation of the wafer occurs, but equal surface areas of the respective heat sink and heat source are still contacted by the wafer. Likewise, referring to FIG. 3 where the distance between the heat source and the heat sink is least (at the center of the transistor), maximum deformation of the wafer occurs, while minimum deformation occurs toward the periphery of the transistor or by the bolts.

Thus, in either of the above examples, the resulting surface area of the transistor and adjacent heat sink portion which is in direct contact with the thermally conductive wafer is about 50 to 60 percent of the total adjacent surface area of the transistor, rather than having 5 to 10 percent of the adjacent area between the heat source and heat sink in contact if the wafer weren't used.

Therefore, in accordance with this invention, due to the significantly increased surface area of the transistor, which is now thermally connected to the heat sink via the thermally conductive dimpled wafer, the amount of heat which can be transferred from the transistor to the heat sink is greatly increased, thereby enabling the transistor to operate at higher power levels, and the transistors can now be used to drive greater loads than would otherwise be possible without the use of the wafer as described in this invention.

Although this invention has been described with reference to a specific embodiment thereof, numerous modifications are possible without departing from the invention, and it is desirable to cover all modifications falling within the spirit and scope of this invention.

What we claim as new and desire to secure by Letters Patent of the United States is:

1. A heat transfer arrangement comprising:
   (a) a heat source;
   (b) a heat sink; and
   (c) a malleable wafer having a plurality of dimples thereon, said dimpled wafer being deformed between said heat source and said heat sink during emplacement therebetween for providing increased direct contacting of the adjacent heat sink and heat source surfaces, whereby to improve the thermal conductivity therebetween.

2. A heat transfer arrangement according to claim 1, wherein said heat source is a power transistor.

3. A heat transfer arrangement according to claim 2, wherein said power transistor is housed within a $TO_3$ type package.

4. A heat transfer arrangement according to claim 1, wherein said wafer has an areal dimension approximately the same as the areal dimension of the adjacent surface of said heat source.

5. A heat transfer arrangement according to claim 1, wherein said wafer is dimpled to approximately its same normal thickness.

6. A heat transfer arrangement according to claim 1, wherein said deformed wafer is in contact with approximately a minimum of 50% of the adjacent juxtaposed surface of each of said heat sink and said heat source.

7. A heat transfer arrangement according to claim 1, wherein said dimples of said wafer number approximately 21 per lineal inch, and are spaced apart by a distance of approximately 10 to 60 mils center to center, while said wafer is approximately 5 mils thick.

8. A heat transfer arrangement according to claim 1, wherein the yield strength of said wafer is less than 1000 psi.

9. A heat transfer arrangement according to claim 1, wherein said wafer is comprised of a material selected from a group comprising gold, silver, zinc and lead.

10. A heat transfer arrangement according to claim 1, wherein said dimples of said wafer extend from a top surface thereof.

11. A heat transfer arrangement according to claim 10, further comprising an adhesive attached to the top surface of said wafer to bond the top surface of said wafer to said heat source.

12. A heat transfer arrangement according to claim 1, wherein said dimples of said wafer are arranged in rows, and each of said rows of dimples is staggered with respect to an adjacent row of dimples to maximize the density of said dimples on said wafer.

* * * * *